United States Patent [19]

Muchnick

[11] 3,932,790

[45] Jan. 13, 1976

[54] GROUND FAULT INTERRUPTER WITH REVERSED LINE POLARITY LAMP INDICATOR

[75] Inventor: Paul Muchnick, Norwalk, Conn.

[73] Assignee: Harvey Hubbell, Incorporated, Bridgeport, Conn.

[22] Filed: Feb. 22, 1972

[21] Appl. No.: 228,075

[52] U.S. Cl. ............ 317/18 D; 324/133; 340/253 R
[51] Int. Cl.² ..................... H02H 1/02; G08B 21/00
[58] Field of Search ................. 317/18 D, 18 B, 48; 324/51, 133, 66; 340/253 R, 258 C; 307/127

[56] References Cited
UNITED STATES PATENTS 3,313,960  4/1967  Borys ............................ 340/258 C
3,548,259  12/1970  McDonald ........................ 317/18 D Primary Examiner—J. D. Miller
Assistant Examiner—Harry E. Moose, Jr.
Attorney, Agent, or Firm—Wooster, Davis & Cifelli

[57] ABSTRACT

A ground fault interrupter (GFI) provided with a reversed line polarity lamp indicator to indicate proper installation of the GFI. The reversed line polarity lamp indicator includes a push button and a lamp connected in series between the line conductor of the GFI and ground. In a wiring system having a ground conductor, the series connection is between the line and the ground conductor in which case the reversed line polarity lamp indicator may also be used to check for open circuits in the ground conductor.

8 Claims, 1 Drawing Figure

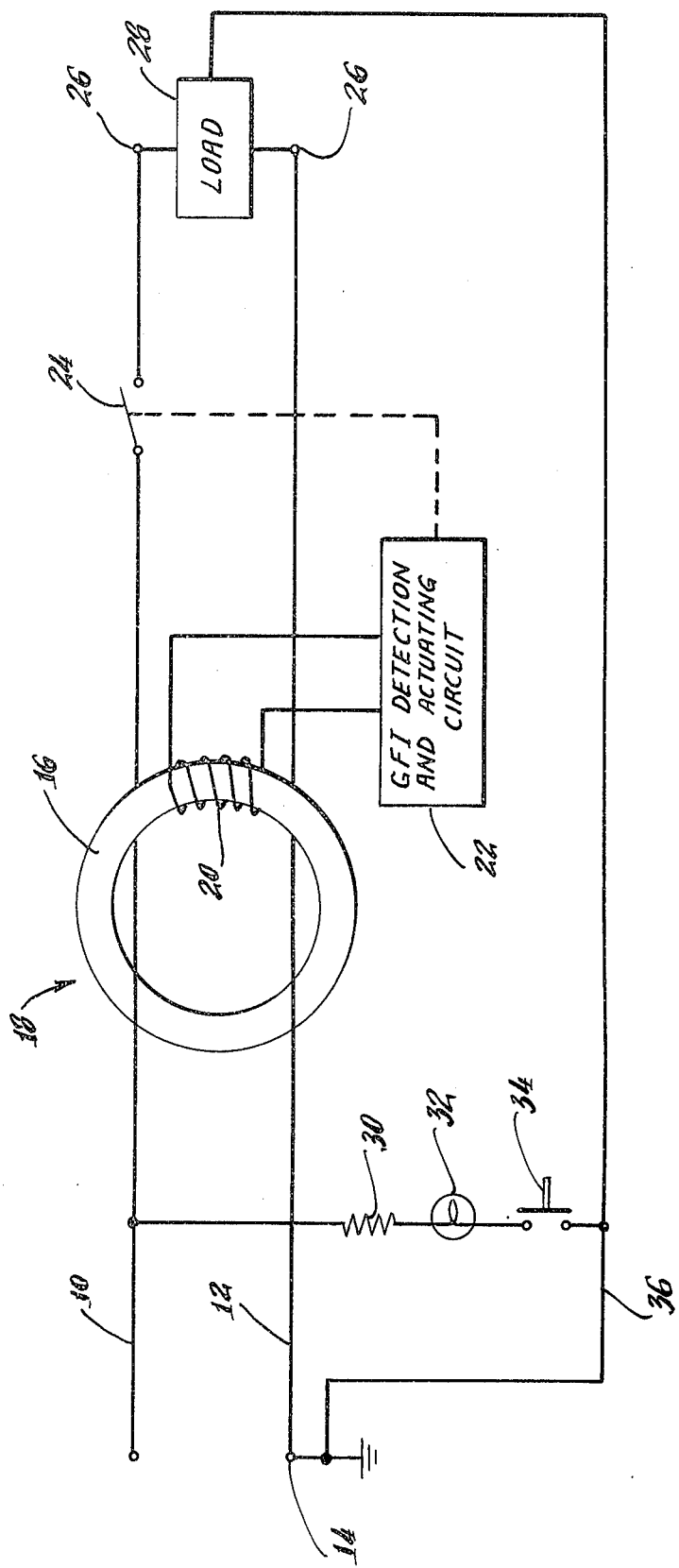

GROUND FAULT INTERRUPTER WITH REVERSED LINE POLARITY LAMP INDICATOR

BACKGROUND OF THE INVENTION

This invention relates to ground fault interrupters (GFIs) and more particularly to a GFI provided with an indicator for indicating whether the GFI has been properly installed.

GFIs are devices which detect ground leakage currents of such small magnitudes that normal overload and short circuit breakers or fuses are not responsive thereto, but which could well be lethal currents to human beings. Although the sensitivity of such devices varies, they have typically been designed to open the circuit if the leakage current exceeds 5 milliamps. Their importance in protecting human life is readily apparent when one considers that currents in excess of 60 milliamps are generally lethal and, depending on the physical condition of the person and the electrical path which is created, substantially smaller currents can also be lethal or, at the least, quite painful and dangerous.

It is, therefore, quite important to encourage the installation and use of GFIs in industrial and residential use, especially under specific circumstances where the likelihood of potential hazards is greater or the possibilities of lethal currents are more probable. One such use would be in electrical circuits for home swimming pools.

To encourage their use, it is desirable to provide less expensive GFIs as well as reducing the size of such models for more convenient installation. It is also apparent that, although in many instances GFIs will typically be installed by trained technicians, it is a good possibility that many home owners and amateur electricians will endeavor to reduce their cost and install GFIs themselves.

In GFIs, it is only necessary to provide a circuit breaker in series with the line conductor of the wiring system to safely disconnect the circuit should leakage current occur. However, if the interrupter is improperly installed and the circuit breaker is connected in series with the neutral conductor, rather than the line conductor, then the interrupter will not provide the protection it is designed for. For this reason, circuit breakers are included in series with both the line and neutral conductors in units likely to be installed by the amateur to provide adequate protection even if the lines are reversely connected during installation. In fact, the Underwriters Laboratories has required such dual circuit breakers in GFIs likely to be installed by an amateur. This, however, needlessly increases the cost of the item by necessitating the provision of an additional circuit breaker and also increases the space requirements of the interrupter, inasmuch as a circuit breaker occupies a substantial volume in relation to the other components of a GFI.

SUMMARY OF THE INVENTION

The present invention overcomes these problems by providing a GFI with a reversed line polarity lamp indicator which may be used to test whether the installation is proper. The reversed line polarity lamp indicator includes a lamp and push button connected in series between ground and a conductor of the GFI which includes a circuit breaker in series therewith. Thus, the present invention provides a convenient check of the installation to insure that the conductor of the GFI having the circuit breaker has been connected to the line conductor of the wiring system for, if not, upon depression of the push button the lamp will not be illuminated. A further advantage of the present invention results when it is used with a wiring system having a ground conductor. In such a system the reversed line polarity lamp indicator is connected to ground through the ground conductor. If the potentially hazardous condition of an open ground conductor exists, the lamp will fail to illuminate upon depression of the push button even though the installation of the GFI may have been proper. Thus, the present invention allows the cost and size of the GFI to be reduced, prevents improper installation and provides a check of the ground conductor of the wiring system.

It is, therefore, a general object of the present invention to provide an improved GFI which obviates the problems and disadvantages of previously known GFIs.

It is a more specific object of the present invention to provide a GFI having an indicator for testing the correctness of installation.

It is another object of the present invention to provide a GFI having an indicator for checking the continuity of the ground conductor.

It is still another object of the present invention to provide a GFI of reduced size and cost while still assuring proper installation and operation of the GFI.

BRIEF DESCRIPTION OF THE DRAWING

These as well as other objects and advantages of the present invention will become apparent to those skilled in the art from a perusal of the appended claims and the following detailed description when read in conjunction with the attached drawing which is a schematic diagram of a preferred embodiment of the present invention.

DETAILED DESCRIPTION OF THE PREFERRED EMBODIMENT

Now, referring to the drawing, the present invention is applied to a power source including a line and a grounded neutral. The GFI includes a conductor 10 to be connected to the line, and a conductor 12 to be connected to the neutral. For convenience and clarity of description, the conductors 10 and 12 will hereinafter be referred to as the GFI line and neutral conductors, respectively. The GFI neutral conductor 12 is grounded as is shown at 14. In reality this ground will be on the neutral of the source and is typically placed at the panel box.

Both the GFI line and neutral conductors 10 and 12 pass through the winding window of a core 16 of a differential transformer 18. The differential transformer 18 includes a multiturn secondary wiring 20 provided on the core 16 which is connected to a GFI detection and actuating circuit 22 which may be any conventional type of which many variations exist. An output of the detection and actuating circuit 22 controls a single circuit breaker 24 connected in series with the GFI line conductor 10. The GFI line and neutral conductors 10 and 12 terminate in output terminals 26 across which a load 28 may be connected.

As described thus far, the circuit is nothing more than a conventional GFI circuit except for the fact that if amateur installation is probable a second circuit breaker would be included in the GFI neutral conductor 12 so that if the GFI line and neutral conductors were reversed during installation the GFI would still function properly. The present invention lies in the combination of this conventional GFI circuit with a reversed line polarity lamp indicator. This includes a current limiting resistor 30, a lamp 32, which for long life may be a conventional neon lamp, and a push button 34 connected in series between the GFI line conductor 10 and ground. As shown in the drawing, the connection to ground is provided through a ground conductor 36, if such a ground conductor is included in the wiring system. If the ground conductor 36 is not available, the connection may be made to any suitable ground.

In operation, the GFI will function in a conventional manner with the GFI detection and actuating circuit 22 responding to induced voltage in the secondary winding 20 due to an imbalance in the current flowing in the GFI line and neutral conductors 10 and 12. If the current imbalance is of sufficient magnitude, the GFI detection and actuating circuit 22 will cause the circuit breaker 24 to open to disconnect the load 28 from the power source.

The reversed line polarity lamp indicator acts as a check to make sure the wiring of the GFI is proper and also provides a permanently available check of the continuity of the ground conductor 36 is the wiring system includes a ground conductor.

In use, when the GFI with reversed line polarity lamp indicator is connected to the wiring of the system, the push button 34 will be actuated to close the circuit between ground and conductor 10. If conductor 10 has been properly wired to the power source line, then current will flow through current limiting resistor 30 and the lamp 32 to illuminate the lamp 32 thereby indicating proper installation of the GFI. If the lamp 32 is not illuminated, then it is most likely that the conductors of the GFI have been incorrectly connected to the power source and the wiring may be corrected and the push button 34 again actuated to make sure that the GFI is now properly installed.

It will also be apparent that failure of the lamp 32 to illuminate can also be due to an open condition in the ground conductor 36 or possibly could be due to failure of the lamp or an open circuit condition in the indicator circuit. In any case, failure of the lamp to operate is an important warning signal that a potential hazard may exist and corrective maintenance should be undertaken. An open circuit in the ground wire 36 is a potentially hazardous condition and should be corrected. Similarly, failure of the reversed line polarity lamp indicator should also be corrected so that future checking of the continuity of the ground conductor is available and at the least that the installation of the GFI is proper.

Once the GFI is properly installed, the reversed line polarity lamp indicator may be used thereafter to check the continuity of the ground conductor 36 from the point of installation of the GFI to the source of grounding. It should be noted that the provision of the push button 34 permits current to flow through the lamp only when the circuit is being tested thereby eliminating any potentially hazardous currents from continuously flowing, eliminating an otherwise continuous power drain, and preserving the operational life of the lamp 32.

Without the reversed line polarity lamp indicator circuit in combination with the GFI, it would be necessary to provide a circuit breaker in both the GFI line and neutral conductors inasmuch as if the GFI were improperly installed and the circuit breaker were in series with the power source neutral, no protection against ground leakage currents would be provided. By the provision of the reversed line polarity lamp indicator, the correctness of the installation may be checked to insure that the GFI line conductor 10 in which the circuit breaker is connected is properly connected to the power source line. Thus, the need for a second circuit breaker in series with the GFI neutral conductor is obviated and the additional cost and space requirements of such a circuit breaker are avoided.

Thus, an improved GFI has been provided which is reduced in cost and size, and provides a fail-safe indication of proper installation. The improved GFI also provides a fail-safe indication of an open condition of a ground conductor where the wiring system includes such a conductor.

It will be apparent to those skilled in the art that various changes and modifications may be made in the present invention without departing from the spirit and scope of this invention. Therefore, the foregoing description should be construed as illustrative only rather than limiting.

What is claimed is:

1. A ground fault interrupter comprising:
    a pair of conductors having input terminals adapted to be connected to an AC power supply having a line and a grounded neutral, and output terminals adapted to be connected to a load;
    circuit breaker means connected in series with a first of said conductors;
    current sensing means for sensing differences in current flowing in said conductors and generating a signal responsive thereto;
    detection and actuation means for receiving said signal and opening said circuit breaker means when said signal indicates a difference current of a predetermined magnitude, and
    reversed line polarity indicating means associated with said conductors for indicating proper connection of said first of said conductors to said line of said AC power supply, said reversed line polarity indicating means including circuit means for giving an indication of whether or not said first of said conductors is connected to said line of said AC power supply, and actuating means for selectively connecting said circuit means between one of said conductors and ground.

2. The ground fault interrupter of claim 1 wherein said circuit means is selectively connected to said first of said conductors.

3. The ground fault interrupter of claim 1 wherein said actuating means is a manually operable push button.

4. The ground fault interrupter of claim 1 wherein said circuit means includes a lamp for indicating whether or not said first of said conductors is connected to said line of said AC power supply.

5. The ground fault interrupter of claim 4 wherein said circuit means further includes a current limiting resistor in series with said lamp.

6. A ground fault interrupter comprising:
    a pair of conductors having input terminals adapted to be connected to an AC power supply having a line and a grounded neutral, and output terminals adapted to be connected to a load;

circuit breaker means connected in series with a first of said conductors;

current sensing means for sensing differences in current flowing in said conductors and generating a signal responsive thereto;

detection and actuation means for receiving said signal and opening said circuit breaker means when said signal indicates a difference current of a predetermined magnitude; and reversed line polarity indicating means associated with said conductors for indicating proper connection of said first of said conductors to said line of said AC power supply, said reversed line polarity indicating means including a lamp and selectively operated actuating means for connecting said lamp between one of said conductors and ground, the illumination or nonillumination of said lamp being indicative of which of said conductors is connected to said line of said AC power supply.

7. The ground fault interrupter of claim 6 wherein said actuating means selectively connects said lamp to said first of said conductors, thereby rendering illumination of the lamp an indication of proper connection of said first of said conductors to said line of said AC power supply.

8. The ground fault interrupter of claim 6 wherein said AC power supply further includes a ground conductor and wherein said actuating means selectively connects said lamp to ground through said ground conductor.

* * * * *